(12) United States Patent
Lan et al.

(10) Patent No.: US 10,910,254 B2
(45) Date of Patent: Feb. 2, 2021

(54) TRANSFER DEVICE

(71) Applicant: Au Optronics Corporation, Hsinchu (TW)

(72) Inventors: Yi-Fen Lan, Taichung (TW); Tsung-Tien Wu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 298 days.

(21) Appl. No.: 16/100,228

(22) Filed: Aug. 10, 2018

(65) Prior Publication Data
US 2019/0148213 A1 May 16, 2019

(30) Foreign Application Priority Data
Nov. 13, 2017 (TW) .............................. 106139147 A

(51) Int. Cl.
H01L 21/687 (2006.01)
H01L 25/075 (2006.01)
H01L 33/00 (2010.01)

(52) U.S. Cl.
CPC .... H01L 21/68778 (2013.01); H01L 25/0753 (2013.01); H01L 33/00 (2013.01); H01L 33/0095 (2013.01)

(58) Field of Classification Search
CPC . H01L 21/687; H01L 21/6878; H01L 25/075; H01L 27/0753; H01L 33/00; H01L 33/0095
See application file for complete search history.

(56) References Cited

U.S. PATENT DOCUMENTS

| | | | |
|---|---|---|---|
| 6,169,652 B1 * | 1/2001 | Klebanoff | G03F 7/707 361/234 |
| 9,969,078 B2 | 5/2018 | Chen et al. | |
| 2013/0127020 A1 | 5/2013 | Bibl et al. | |

(Continued)

FOREIGN PATENT DOCUMENTS

| | | |
|---|---|---|
| CN | 104538344 | 4/2015 |
| CN | 104597643 | 5/2015 |

(Continued)

*Primary Examiner* — Matthew V Nguyen
(74) *Attorney, Agent, or Firm* — JCIPRNET

(57) ABSTRACT

A transfer device including a first electrode set, a second electrode set, a shielding element, a driving circuit and an elastomer is provided. The first electrode set includes a first electrode configured to receive a first voltage and a second electrode configured to receive a second voltage and structurally separated from the first electrode, wherein a voltage difference exists between the first voltage and the second voltage. The second electrode set disposed adjacent to the first electrode set includes a third electrode configured to receive a third voltage and a fourth electrode configured to receive a fourth voltage and structurally separated from the third electrode, wherein a voltage difference exists between the third voltage and the fourth voltage. The shielding element is disposed on a substrate and located between the first electrode set and the second electrode set. The driving circuit is electrically connected to the first electrode set and the second electrode set. The elastomer covers the first electrode set and the second electrode set, wherein the elastomer has a transfer surface.

13 Claims, 8 Drawing Sheets

(56) References Cited

U.S. PATENT DOCUMENTS

| | | | | |
|---|---|---|---|---|
| 2014/0253900 A1* | 9/2014 | Cornelissen | ............ | G03F 7/707 355/72 |
| 2016/0300745 A1 | 10/2016 | Chang et al. | | |
| 2016/0336304 A1* | 11/2016 | Wu | .................... | H01L 21/6835 |
| 2017/0036342 A1 | 2/2017 | Chen et al. | | |
| 2017/0133257 A1* | 5/2017 | Wu | .................... | H01L 21/6835 |

FOREIGN PATENT DOCUMENTS

| | | |
|---|---|---|
| CN | 105150712 | 12/2015 |
| CN | 106058001 | 10/2016 |
| CN | 106378894 | 2/2017 |
| CN | 106395736 | 2/2017 |
| CN | 104067379 | 8/2017 |

\* cited by examiner

TRANSFER DEVICE

CROSS-REFERENCE TO RELATED APPLICATION

This application claims the priority benefit of Taiwan application serial no. 106139147, filed on Nov. 13, 2017. The entirety of the above-mentioned patent application is hereby incorporated by reference herein and made a part of this specification.

BACKGROUND

Technical Field

The disclosure relates to a transfer device and particularly relates to a transfer device configured to transfer micro-light emitting diodes (micro-LEDs).

Description of Related Art

Techniques of transferring micro-light emitting diodes have already been applied to the processes of new electronic devices. Take the process of a light emitting device as an example, the process of the light emitting device includes the following steps: provide a transfer stamp having a plurality of transfer bumps; provide a light emitting array that includes a plurality of target light emitting elements; bring the transfer bumps of the transfer stamp in contact with the target light emitting elements to pick up a plurality of target light emitting elements as desired; transfer the target light emitting elements onto a receiving substrate using the transfer stamp; and fabricate other structures on the receiving substrate carrying the plurality of light emitting elements so as to complete the light emitting device. However, when the scale of the transfer process is expanded, the current transfer method using the transfer stamp having a plurality of transfer bumps encounters problems such as low process yield, poor precision, and unsuitability for mass production.

SUMMARY

The disclosure provides a transfer device that achieves high process yield and operation precision when applied to a mass transfer process and that reduces the phenomenon of electric field crosstalk during a transfer operation.

The transfer device of the disclosure includes a first electrode set, a second electrode set, a shielding element, a driving circuit and an elastomer. The first electrode set is disposed on the substrate and includes a first electrode and a second electrode. The first electrode is configured to receive a first voltage, and the second electrode is configured to receive a second voltage and structurally separated from the first electrode, wherein a voltage difference exists between the first voltage and the second voltage. The second electrode set is disposed on the substrate and disposed adjacent to the first electrode set, wherein the second electrode set includes a third electrode and a fourth electrode. The third electrode is configured to receive a third voltage, and the fourth electrode is configured to receive a fourth voltage and structurally separated from the third electrode, wherein a voltage difference exists between the third voltage and the fourth voltage. The shielding element is disposed on the substrate and located between the first electrode set and the second electrode set. The driving circuit is disposed on the substrate and electrically connected to the first electrode set and the second electrode set. The elastomer is disposed on the substrate and covers the first electrode set and the second electrode set, wherein the elastomer has a transfer surface.

Based on the foregoing, in the transfer device provided by this disclosure, the elastomer having the transfer surface covers the first electrode set and the second electrode set that are adjacent to each other, and the shielding element is disposed between the adjacent first and second electrode sets, wherein the first electrode set includes the first electrode configured to receive the first voltage and the second electrode configured to receive the second voltage, the second electrode set includes the third electrode configured to receive the third voltage and the fourth electrode configured to receive the fourth voltage, a voltage difference exists between the first voltage and the second voltage and a voltage difference exists between the third voltage and the fourth voltage. As a result, the transfer device in this disclosure may achieve the transfer function without any patterned structure disposed on the transfer surface, and the phenomenon of electric field crosstalk between the first electrode set and the second electrode set is reduced due to the shielding effect of the shielding element. In this way, compared with the conventional transfer device having a plurality of transfer bumps, the transfer device in this disclosure may achieve high process yield and operation precision when applied to the mass transfer process. Besides, when the transfer device in this disclosure is used to transfer a micro-LED(s), it is possible to selectively transfer a specific micro-LED(s).

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
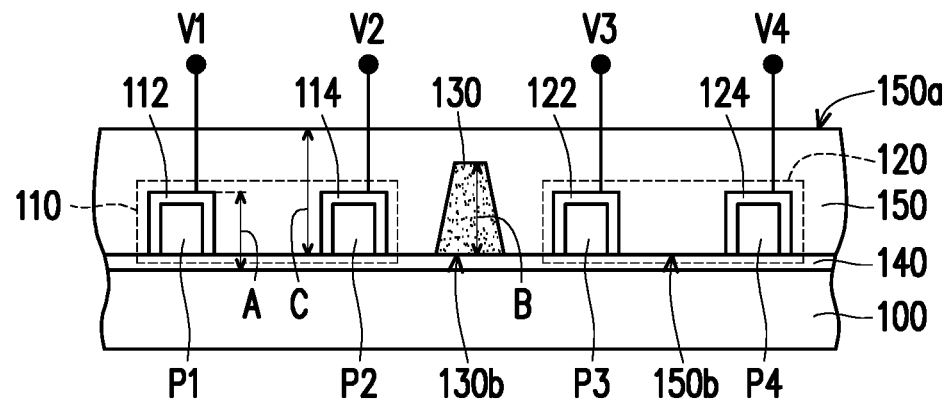
FIG. 1 is a schematic cross-sectional view of a transfer device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected (coupled). Therefore, intervening elements may be present in an electrical connection (coupling) between two elements.

The term "about," "approximately," or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±15%, ±10%, ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that ten is, such as those defined in commonly used dictionaries, should be interpreted as having a meaning that is consistent with their meaning in the context of the relevant art and the disclosure and will not be interpreted in an idealized or overly formal sense unless expressly so defined herein.

Exemplary embodiments are described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shape of the regions, and are not intended to limit the scope of the claims.

Figure 2:
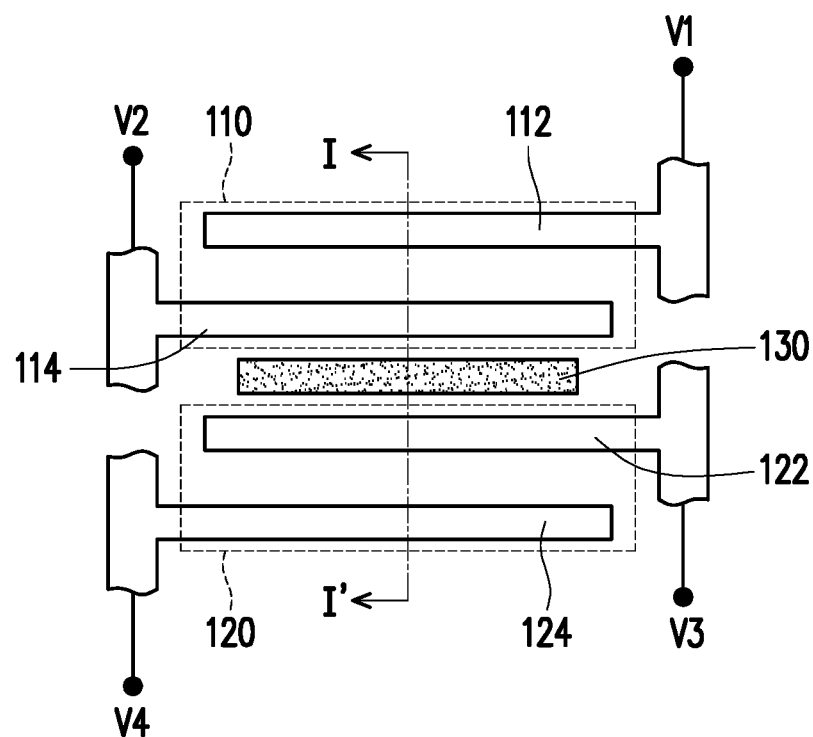
FIG. 2 is a schematic top view illustrating the configuration relationship between the first electrode set, the second electrode set and the shielding element in FIG.

FIG. 1 is a schematic cross-sectional view of a transfer device according to an embodiment of the disclosure. FIG. 2 is a schematic top view illustrating the configuration relationship between the first electrode set, the second electrode set and the shielding element in FIG. 1. The cross-sectional view as shown in FIG. 1 corresponds to a view taken along the cross-sectional line I-I' of FIG. 2.

With reference to FIG. 1 and FIG. 2 simultaneously, in this embodiment, a transfer device 10 includes a substrate 100, a first electrode set 110, a second electrode set 120, a shielding element 130, a driving circuit 140 and an elastomer 150. In addition, in this embodiment, the transfer device 10 may further include a first bump P1, a second bump P2, a third bump P3 and a fourth bump P4.

The substrate 100 is configured to carry the first electrode set 110, the second electrode set 120, the shielding element 130, the driving circuit 140 and the elastomer 150. In this embodiment, the material of the substrate 100 is, for example, glass, quartz, or an organic polymer.

The first electrode set 110 is disposed on the substrate 100. The first electrode set 110 includes a first electrode 112 and a second electrode 114, wherein the first electrode 112 and the second electrode 114 are structurally separated from each other. The first electrode 112 is configured to receive a first voltage V1, the second electrode 114 is configured to receive a second voltage V2, and a voltage difference exists between the first voltage V1 and the second voltage V2. In other words, in this embodiment, the first electrode 112 and the second electrode 114 are electrically connected to different voltage sources. Furthermore, since a voltage difference exists between the first voltage V1 and the second voltage V2, when the first voltage V1 is applied to the first electrode 112 and the second voltage V2 is applied to the second electrode 114, a lateral electric field is formed between the first electrode 112 and the second electrode 114.

The second electrode set 120 is disposed on the substrate 100 and disposed adjacent to the first electrode set 110. The second electrode set 120 includes a third electrode 122 and a fourth electrode 124, wherein the third electrode 122 and the fourth electrode 124 are structurally separated from each other. The third electrode 122 is configured to receive a third voltage V3, the fourth electrode 124 is configured to receive a fourth voltage V4, and a voltage difference exists between the third voltage V3 and the fourth voltage V4. In other words, in this embodiment, the third electrode 122 and the fourth electrode 124 are electrically connected to different voltage sources. Furthermore, since a voltage difference exists between the third voltage V3 and the fourth voltage V4, when the third voltage V3 is applied to the third electrode 122 and the fourth voltage V4 is applied to the fourth electrode 124, a lateral electric field is formed between the third electrode 122 and the fourth electrode 124.

In addition, in this embodiment, the first voltage V1 is substantially the same as the third voltage V3, and the second voltage V2 is substantially the same as the fourth voltage V4. In other words, in this embodiment, the third electrode 122 and the first electrode 112 are electrically connected to the same voltage source, and the fourth electrode 124 and the second electrode 114 are electrically connected to the same voltage source. From another perspective, in this embodiment, if the first voltage V1 and the third voltage V3 are high voltages, the second voltage V2 and the fourth voltage V4 are low voltages.

In this embodiment, the first bump P1, the second bump P2, the third bump P3 and the fourth bump P4 are disposed on the substrate 100. Besides, the first bump P1, the second bump P2, the third bump P3 and the fourth bump P4 are disposed correspondingly to the first electrode 112, the second electrode 114, the third electrode 122 and the fourth electrode 124 respectively. Specifically, in this embodiment, the first electrode 112 covers a top surface and a side surface of the first bump P1, the second electrode 114 covers a top surface and a side surface of the second bump P2, the third electrode 122 covers a top surface and a side surface of the third bump P3, and the fourth electrode 124 covers a top surface and a side surface of the fourth bump P4.

In addition, in this embodiment, materials of the first bump P1, the second bump P2, the third bump P3 and the fourth bump P4 are, for example, insulating materials. The insulating materials include, for example, an inorganic material, an organic material, a combination of the foregoing or a stack layer thereof. Here, the inorganic material is (but not limited to) silicon oxide, silicon nitride, silicon oxynitride, a combination of the foregoing or other suitable materials, for example; and the organic material is (but not limited to) polyester (PET), polyalkene, polyacryl, polycarbonate, polyalkylene oxide, polyphenylene, polyether, polyketone, polyalcohol, polyaldehyde, a combination of the foregoing or other suitable materials, for example.

In addition, in this embodiment, although FIG. 1 shows that the first electrode 112, the second electrode 114, the third electrode 122, and the fourth electrode 124 respectively cover the top surface and the side surface of the first bump P1, the top surface and the side surface of the second bump P2, the top surface and the side surface of the third bump P3, and the top surface and the side surface of the fourth bump P4, the disclosure is not limited thereto. In other embodiments, the first electrode 112, the second electrode 114, the third electrode 122 and the fourth electrode 124 may cover only the top surface of the first bump P1, the top surface of the second bump P2, the top surface of the third bump P3 and the top surface of the fourth bump P4 respectively. In further embodiments, the first electrode 112, the second electrode 114, the third electrode 122 and the fourth electrode 124 may cover the top surface and a portion of the side surface of the first bump P1, the top surface and a portion of the side surface of the second bump P2, the top surface and a portion of the side surface of the third bump P3, and the top surface and a portion of the side surface of the fourth bump P4 respectively.

In addition, in this embodiment, although FIG. 1 shows that the cross-sectional contours of the first bump P1, the second bump P2, the third bump P3 and the fourth bump P4 are in a rectangular shape, the disclosure is not limited thereto. In other embodiments, the cross-sectional contours of the first bump P1, the second bump P2, the third bump P3 and the fourth bump P4 may also be in a trapezoidal shape or a double-trapezoidal shape.

The shielding element 130 is disposed on the substrate 100 and located between the first electrode set 110 and the second electrode set 120. In this embodiment, the shielding element 130 is located between the second electrode 114 in the first electrode set 110 and the third electrode 122 in the second electrode set 120. In this embodiment, the material of the shielding element 130 is, for example, an insulating material. The insulating material includes, for example, an inorganic material, an organic material, a combination of the foregoing or a stack layer thereof. Here, the inorganic material is (but not limited to) silicon oxide, silicon nitride, silicon oxynitride, a combination of the foregoing or other suitable materials, for example; and the organic material is (but not limited to) polyester (PET), polyalkene, polyacryl, polycarbonate, polyalkylene oxide, polyphenylene, polyether, polyketone, polyalcohol, polyaldehyde, a combination of the foregoing or other suitable materials, for example. In addition, in this embodiment, the dielectric constant of the shielding element 130 is in a range of 0.1 to 15.

Figure 3A:
FIGS. 3A, 3B, 3C, 3D and 3E are schematic cross-sectional views of alterations and modifications of the shielding element respectively.
Figure 3B:
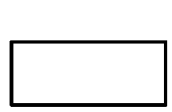
Figure 3C:
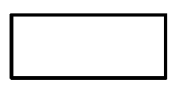
Figure 3D:
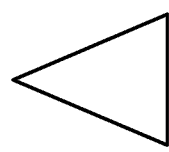
Figure 3E:
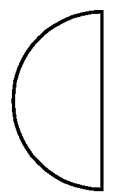

In this embodiment, the cross-sectional contour of the shielding element 130 is in a trapezoidal shape, but the disclosure is not limited thereto. In other embodiments, the cross-sectional contour of the shielding element 130 may also be in an inverted trapezoidal shape (as shown in FIG. 3A), a double-trapezoidal shape (as shown in FIG. 3B), a rectangular shape (as shown in FIG. 3C), a triangular shape (as shown in FIG. 3D), or an arc shape (as shown in FIG. 3E).

The driving circuit 140 is disposed on the substrate 100 and electrically connected to the first electrode set 110 and the second electrode set 120 so as to electrically connect external signals (such as the first voltage V1, the second voltage V2, the third voltage V3, the fourth voltage V4) to the first electrode set 110 and the second electrode set 120. In this embodiment, the driving circuit 140 is, for example, an active device array layer, which may be any active device array layer used in a display device known to those skilled in the art. For example, in one embodiment, the driving circuit 140 may include a plurality of signal lines, a plurality of transistors, a plurality of connection pads and a plurality of insulating layers. Here, the first electrode 112 and the third electrode 122 are, for example, respectively electrically connected to the corresponding transistors that serve as switching devices, and the aforesaid transistors may respectively be connected to the corresponding connection pads by the corresponding signal lines so as to be electrically connected to the external signals. The second electrode 114 and the fourth electrode 124 are, for example, respectively electrically connected to the corresponding signal lines, and the aforesaid signal lines are connected to the corresponding connection pads so as to be electrically connected to the external signals. In other words, in this embodiment, the driving circuit 140 may be an active driving circuit.

The elastomer 150 is disposed on the substrate 100 and covers the first electrode set 110 and the second electrode set 120. The elastomer 150 has a transfer surface 150a. Specifically, when the transfer device 10 is not in operation, the entire transfer surface 150a is substantially a single and continuous plane. In other words, in this embodiment, the transfer surface 150a does not have any patterned structure.

In this embodiment, the material of the elastomer 150 is (but not limited to) poly dimethyl siloxane (PDMS), butyl (isobutylene isoprene), ethylene-propylene-diene copolymer (EPDM), ethylene-propylene copolymer (EPM), natural rubber (NR), chloroprene (CR), nitrile-butadiene rubber (NBR), isoprene synthetic rubber (IR), styrene butadiene rubber (SBR), or styrene ethylene butadiene styrene (SEBS), for example. It should be noted that, in this embodiment, the elastomer 150 is used to adhere a micro light emitting diode(s) (micro-LED(s)) so as to pick up the micro-LED(s) during the operation of transferring the micro-LED(s).

In this embodiment, the bottom surface 130b of the shielding element 130 is connected to the bottom surface 150b of the elastomer 150. The bottom surface 150b of the elastomer 150 is disposed opposite to the transfer surface 150a. From another perspective, in this embodiment, the shielding element 130 and the elastomer 150 are substantially disposed on the same plane.

In this embodiment, the first electrode 112, the second electrode 114, the third electrode 122 and the fourth electrode 124 have a topmost point, and a distance A between the aforesaid topmost point and the top surface of the substrate 100, a height B of the shielding element 130 and a thickness C of the elastomer 150 satisfy the following relation: C≥B>A. In other words, in one embodiment, the elastomer 150, besides covering the first electrode set 110 and the second electrode set 120, also covers the shielding element 130; and in another embodiment, the elastomer 150 covers the first electrode set 110 and the second electrode set 120 and is flush with the shielding element 130. Since the thickness C of the elastomer 150 is greater than the height B of the shielding element 130, the element to be transferred may then be prevented from being scratched and damaged by the shielding element 130 during the transfer process. In addition, it should be noted that the shielding element 130 may provide a better shielding effect by making the thickness C of the elastomer 150 greater than or equal to the height B of the shielding element 130 and making the height B of the shielding element 130 greater than the distance A.

In addition, in other embodiments, the height B of the shielding element 130 may also be equal to the distance A, or the thickness C of the elastomer 150 may be equal to both the height B of the shielding element 130 and the distance A.

Besides, in this embodiment, although FIG. 1 shows that the first electrode 112, the second electrode 114, the third electrode 122 and the fourth electrode 124 all have the topmost point, the disclosure is not limited thereto. In other embodiments, there may be only at least one to three of the first electrode 112, the second electrode 114, the third electrode 122 and the fourth electrode 124 that have the topmost point. In other words, the scope of the disclosure covers any case where at least one of the first electrode 112, the second electrode 114, the third electrode 122 and the fourth electrode 124 has the topmost point.

The following should be noted here: in this embodiment, the elastomer 150 having the transfer surface 150a covers the first electrode set 110 and the second electrode set 120, wherein the first electrode set 110 includes the first electrode 112 configured to receive the first voltage V1 and the second electrode 114 configured to receive the second voltage V2, and the second electrode set 120 includes the third electrode 122 configured to receive the third voltage V3 and the fourth electrode 124 configured to receive the fourth voltage V4, and thereby when the transfer device 10 is used to transfer a micro-LED(s), the first voltage V1 and the second voltage V2 can be respectively applied to the first electrode 112 and the second electrode 114 to generate the lateral electric field therebetween and/or the third voltage V3 and the fourth voltage V4 can be respectively applied to the third electrode 122 and the fourth electrode 124 to generate the lateral electric field therebetween. As a result, the corresponding transfer surface 150a of the elastomer 150 affected by the lateral electric field may appear uneven. Thus, the micro-LED(s) adhered onto the corresponding transfer surface 150a is detached from the elastomer 150 to achieve the transfer function.

In view of the foregoing, in this embodiment, the transfer function may be achieved without any patterned structure disposed on the transfer surface 150a. In this way, compared with a conventional transfer device having a plurality of transfer bumps, the transfer device 10 in this embodiment may achieve high process yield and operation precision when applied to a mass transfer process.

Furthermore, in this embodiment, the shielding element 130 is disposed between the first electrode set 110 and the second electrode set 120 that are adjacent to each other, wherein the first electrode set 110 includes the first electrode 112 configured to receive the first voltage V1 and the second electrode 114 configured to receive the second voltage V2, and the second electrode set 120 includes the third electrode 122 configured to receive the third voltage V3 and the fourth electrode 124 configured to receive the fourth voltage V4. As a result, even if a voltage difference exists between the two electrodes adjacent to the shielding element 130, a lateral electric field is not easily generated due to the shielding effect of the shielding element 130, thereby reducing the phenomenon of electric field crosstalk between the first electrode set 110 and the second electrode set 120. Besides, as described above, since the distance A between the top surface of the substrate 100 and the topmost point of the first electrode 112, the second electrode 114, the third electrode 122 and the fourth electrode 124, the height B of the shielding element 130, and the thickness C of the elastomer 150 satisfy the following relation: C≥B>A, the shielding element 130 may provide a better shielding effect.

Based on the foregoing, when the transfer device 10 is used to transfer a micro-LED(s), it is possible to selectively transfer a specific micro-LED(s) corresponding to one of the first electrode set 110 and the second electrode set 120. In the following, an implementation mode of transferring a micro-LED by using the transfer device 10 is described in detail with reference to FIGS. 4A-4D.

FIGS. 4A-4D are schematic cross-sectional views showing a method of transferring a micro-LED using the transfer device of FIG. 1.

Figure 4A:
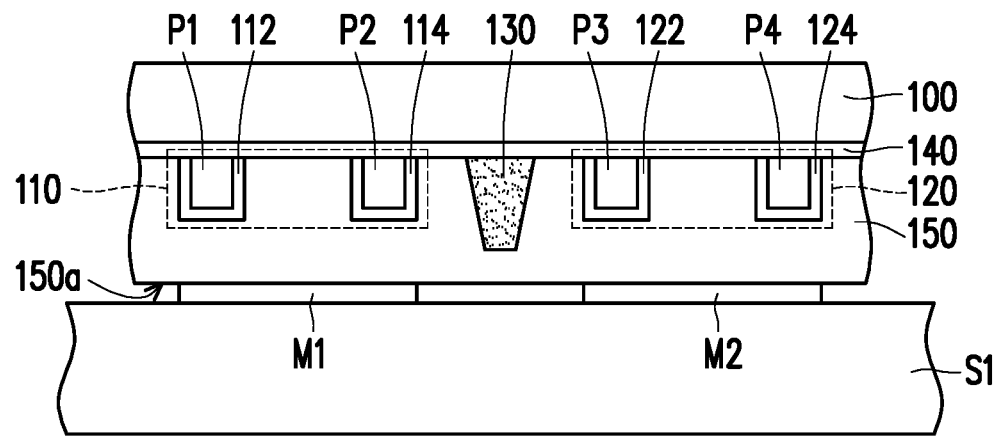
FIGS. 4A-4D are schematic cross-sectional views showing a method of transferring a micro-LED using the transfer device of FIG. 1.
Figure 4B:
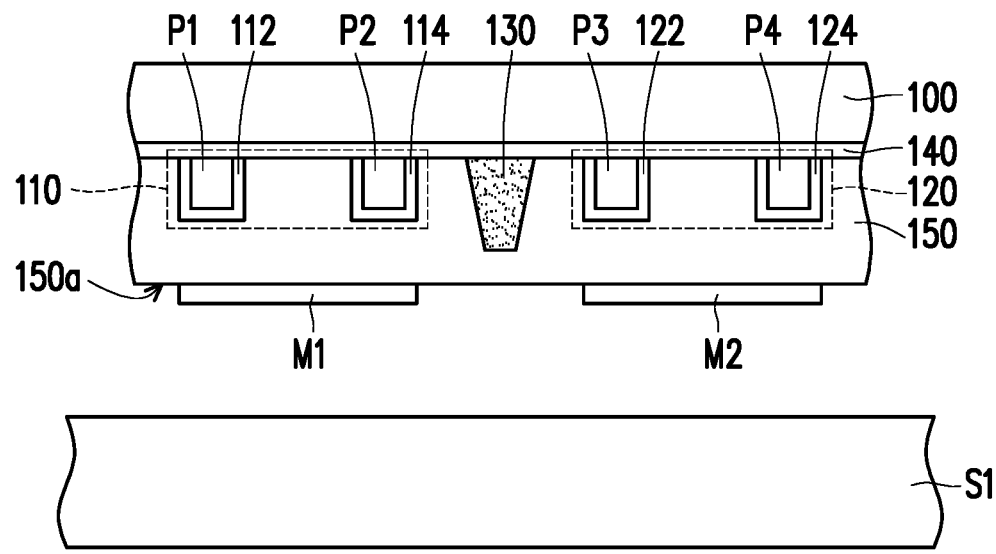

With reference to FIG. 4A, the transfer surface 150a of the elastomer 150 of the transfer device 10 is brought into contact with micro-LEDs M1 and M2 disposed on a carrier substrate S1. Then, with reference to FIG. 4B, the transfer device 10 is moved upward so that the transfer device 10 picks up the micro-LEDs M1 and M2. In the foregoing step, a position of the micro-LED M1 corresponds to a position of the first electrode set 110, and a position of the micro-LED M2 corresponds to a position of the second electrode set 120. The carrier substrate S1 is (but not limited) a sapphire base or a silicon base, for example. The micro-LEDs M1 and M2 are, for example, a flip-chip micro-LED, a vertical micro-LED or an organic micro-LED, respectively.

Figure 4C:
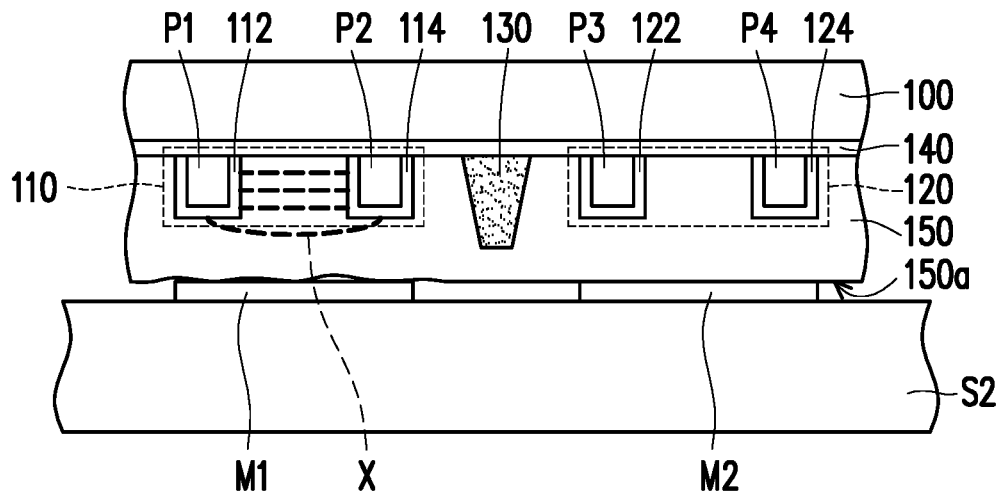

Then, with reference to FIG. 4C, after the micro-LEDs M1 and M2 are placed on a receiving substrate S2 using the transfer device 10, the first voltage V1 and the second voltage V2 are selectively applied to the first electrode 112 and the second electrode 114 in the first electrode set 110 respectively while no voltage is applied to the third electrode 122 and the fourth electrode 124 in the second electrode set 120, so that a lateral electric field X is generated between the first electrode 112 and the second electrode 114. At this time, a portion of the transfer surface 150a corresponding to the first electrode set 110 has an uneven appearance due to the effect of the lateral electric field X on the elastomer 150, and a portion of the transfer surface 150a corresponding to the second electrode set 120 still maintains a flat and even appearance as it is unaffected by the lateral electric field X. Consequently, the micro-LED M1 is naturally detached from the elastomer 150, and the micro-LED M2 is still adhered to the elastomer 150.

Figure 4D:
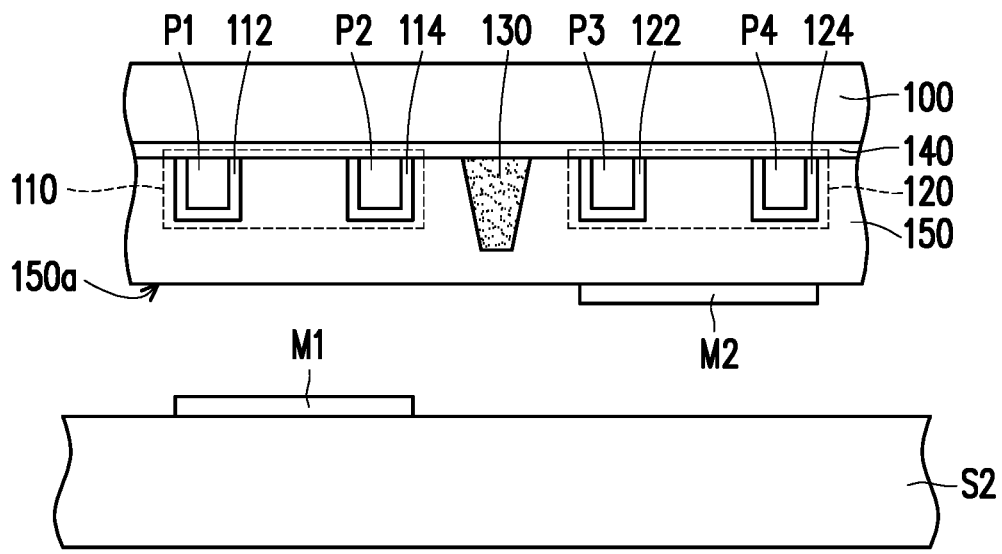

Then, with reference to FIG. 4D, the transfer device 10 is moved upward and voltages are no longer applied to the first electrode 112 and the second electrode 114, thereby completing the procedure of selectively transferring the micro-LED M1.

In light of FIGS. 4A-4D, the transfer device 10 is provided with the shielding element 130 disposed between the first electrode set 110 and the second electrode set 120 so as to reduce the phenomenon of electric field crosstalk between the first electrode set 110 and the second electrode set 120.

As a result, among the micro-LED M1 and the micro-LED M2 that are adjacent to each other, the transfer device 10 may selectively transfer the micro-LED M1 only.

In addition, although FIGS. 4A-4D show how the transfer device 10, among the micro-LED M1 and the micro-LED M2 that are adjacent to each other, selectively transfers the micro-LED M1 only, the disclosure is not limited thereto. In other embodiments, while the first voltage V1 and the second voltage V2 are respectively applied to the first electrode 112 and the second electrode 114 in the first electrode set 110, the third voltage V3 and the fourth voltage V4 are respectively applied to the third electrode 122 and the fourth electrode 124 in the second electrode set 120, so that the transfer surface 150a corresponding to the first electrode set 110 and the second electrode set 120 has an uneven appearance due to the effect of the lateral electric field X on the elastomer 150. Consequently, both the micro-LED M1 and the micro-LED M2 are naturally detached from the elastomer 150, thereby achieving the function of simultaneously picking up and simultaneously placing the micro-LED M1 and the micro-LED M2.

In addition, although not shown in FIGS. 4A-4D, those skilled in the art should understand that the transfer device 10 is assembled with a moving device (such as a mechanical arm) when the transfer device 10 is used to transfer a micro-LED(s).

It should be noted that, in this embodiment, since the driving circuit 140 may be any active device array layer used in a display device known to those skilled in the art, and since the first electrode 112, the second electrode 114, the third electrode 122 and the fourth electrode 124 are substantially disposed on the same plane, the transfer device 10 thus has a design similar to in-plane switching (IPS), thereby making the manufacture of the transfer device 10 compatible with the existing processes of a display device.

In the embodiment of FIG. 1, the first electrode set 110 includes one first electrode 112 and one second electrode 114 and the second electrode set 120 includes one third electrode 122 and one fourth electrode 124, but the disclosure is not limited thereto. In other embodiments, in accordance with the size of the micro-LED(s) to be transferred, the first electrode set 110 may also include a plurality of first electrodes 112 and a plurality of second electrodes 114, and the second electrode set 120 may also include a plurality of third electrodes 122 and a plurality of fourth electrodes 124.

In the following, another implementation mode is described with reference to FIG. 5 and FIG. 6. It should be noted here that the reference numerals and part of the contents of the previous embodiment are used in the following embodiment, in which identical or similar reference numerals indicate identical or similar components, and descriptions of the same technical contents are omitted. Please refer to the description of the previous embodiment for the omitted contents, which will not be repeated hereinafter.

Figure 5:
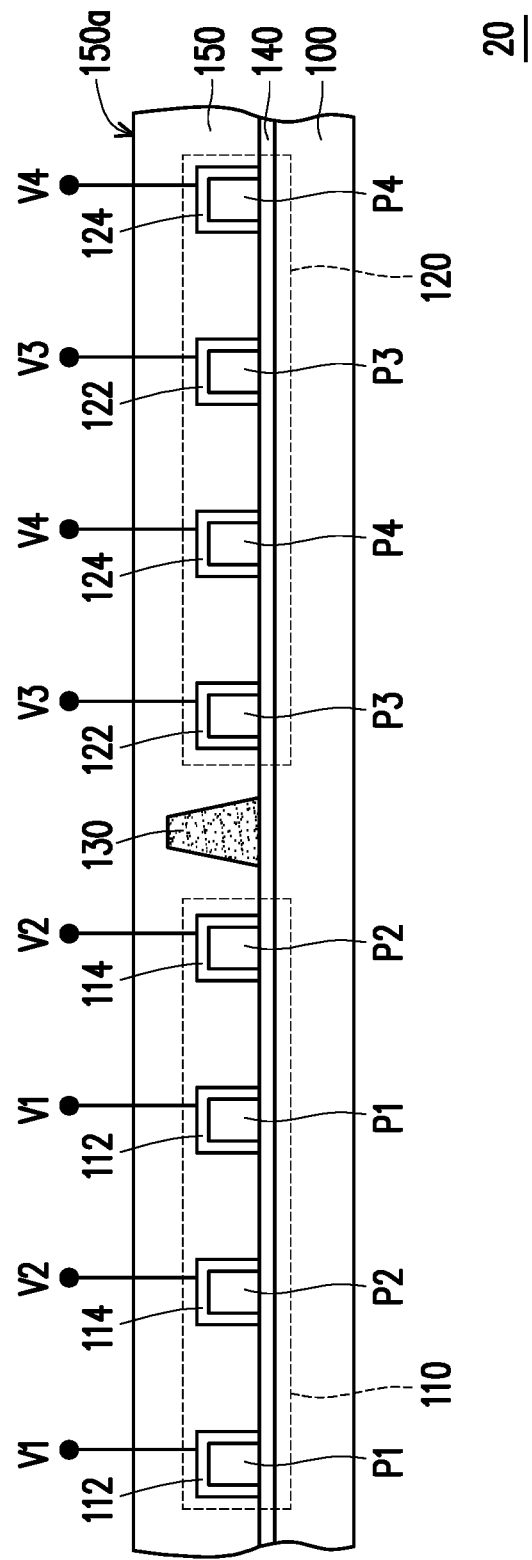
FIG. 5 is a schematic cross-sectional view of a transfer device according to another embodiment of the disclosure.

FIG. 5 is a schematic cross-sectional view of a transfer device according to another embodiment of the disclosure. FIG. 6 is a schematic top view illustrating the configuration relationship between the first electrode set, the second electrode set and the shielding element in FIG. 5. The cross-sectional view as shown in FIG. 5 corresponds to a view taken along the cross-sectional line I-I' of FIG. 6. With reference to FIG. 1 and FIG. 5 simultaneously, a transfer device 20 in FIG. 5 is similar to the transfer device 10 in FIG. 1 as described above. Consequently, only the primary differences between them are described hereinafter.

Figure 6:
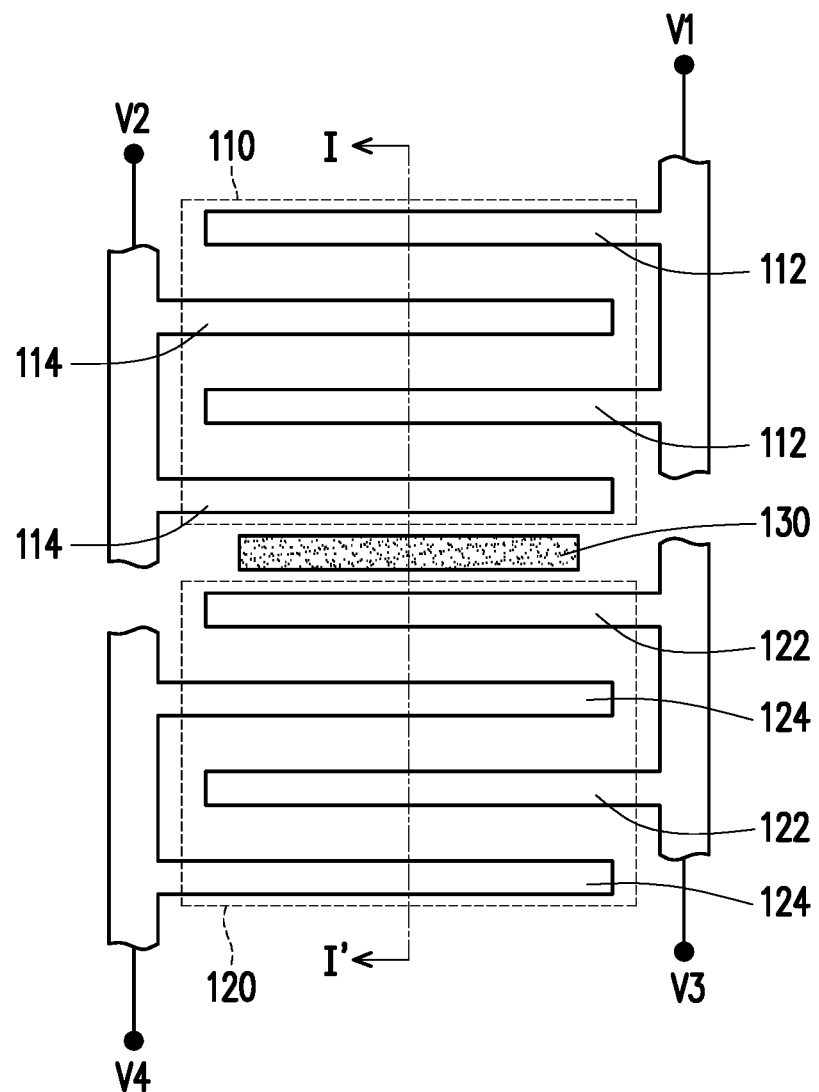
FIG. 6 is a schematic top view illustrating the configuration relationship between the first electrode set, the second electrode set and the shielding element in FIG. 5.

With reference to FIG. 5 and FIG. 6 simultaneously, in this embodiment, the first electrode set 110 includes two first electrodes 112 and two second electrodes 114, wherein the first electrodes 112 and the second electrodes 114 are alternately disposed on the substrate 100, and the second electrode set 120 includes two third electrodes 122 and two fourth electrodes 124, wherein the third electrodes 122 and the fourth electrodes 124 are alternately disposed on the substrate 100. Accordingly, as described above, when the transfer device 20 is used to transfer a micro-LED(s), the transfer device 20, in comparison with the transfer device 10, may be used to transfer a micro-LED(s) having a larger size.

In addition, in the embodiments of FIG. 1 and FIG. 5, the height B of the shielding element 130 is smaller than the thickness C of the elastomer 150, but the disclosure is not limited thereto. In other embodiments, the shielding element may also have a height that is substantially the same as the thickness of the elastomer.

In the following, another implementation mode is described with reference to FIG. 7. It should be noted here that the reference numerals and part of the contents of the previous embodiments are used in the following embodiment, in which identical or similar reference numerals indicate identical or similar components, and descriptions of the same technical contents are omitted. Please refer to the description of the previous embodiments for the omitted contents, which will not be repeated hereinafter.

Figure 7:
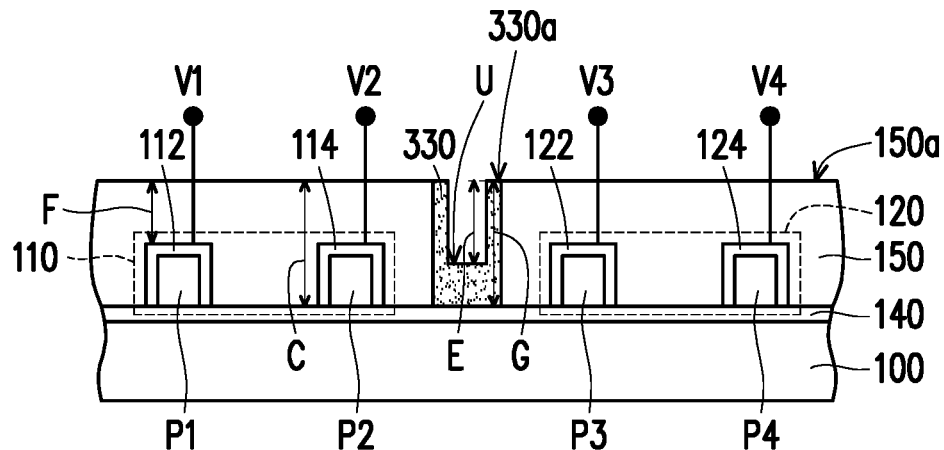
FIG. 7 is a schematic cross-sectional view of a transfer device according to another embodiment of the disclosure.

FIG. 7 is a schematic cross-sectional view of a transfer device according to another embodiment of the disclosure. A transfer device 30 in FIG. 7 is similar to the transfer device 10 in FIG. 1 as described above. Consequently, only the primary differences between them are described hereinafter.

With reference to FIG. 7, a shielding element 330 is disposed on the substrate 100 and located between the first electrode set 110 and the second electrode set 120. Specifically, in this embodiment, the shielding element 330 is located between the second electrode 114 in the first electrode set 110 and the third electrode 122 in the second electrode set 120.

In this embodiment, a surface 330a of the shielding element 330, which is connected to the transfer surface 150a of the elastomer 150, has a recess portion U. In other words, in this embodiment, the shielding element 330 has a height G that is substantially the same as the thickness C of the elastomer 150. In addition, in this embodiment, although FIG. 7 shows that the cross-sectional contour of the recess portion U is in a rectangular shape, the disclosure is not limited thereto. In other embodiments, the cross-sectional contour of the recess portion U may also be in a trapezoidal shape, an inverted trapezoidal shape, a triangular shape or an arc shape.

In this embodiment, the thickness C of the elastomer 150 and a depth E of the recess portion U satisfy the following relation: C>E. On the other hand, in this embodiment, the first electrode 112, the second electrode 114, the third electrode 122 and the fourth electrode 124 have a topmost point, and a distance F between the aforesaid topmost point and the transfer surface 150a and the depth E of the recess portion U satisfy the following relation: E>F. Specifically, in one embodiment, the depth E is approximately 5% to 99% of the thickness C. It should be noted that the shielding element 330 may provide a better shielding effect by making the depth E of the recess portion U greater than the distance F.

In this embodiment, the material of the shielding element 330 may be the same as the material of the elastomer 150.

In other words, the shielding element 330 at this time is integrally formed with the elastomer 150. In addition, the method of forming the shielding element 330 and the elastomer 150 may include the following steps: after a flexible material layer is formed on the substrate 100 where the first electrode set 110, the second electrode set 120 and the driving circuit 140 are formed, a removal process is performed to form the elastomer 150 and the shielding element 330 that has the recess portion U. Herein the removal process includes, for example, a photolithographic etching process.

In addition, in this embodiment, the material of the shielding element 330 may also be different from the material of the elastomer 150. At this time, the material of the shielding element 330 is, for example, an insulating material. The insulating material includes, for example, an inorganic material, an organic material, a combination of the foregoing or a stack layer thereof. Here, the inorganic material is (but not limited to) silicon oxide, silicon nitride, silicon oxynitride, a combination of the foregoing or other suitable materials, for example; and the organic material is (but not limited to) polyester (PET), polyalkene, polyacryl, polycarbonate, polyalkylene oxide, polyphenylene, polyether, polyketone, polyalcohol, polyaldehyde, a combination of the foregoing or other suitable materials, for example. In addition, the method of forming the shielding element 330 and the elastomer 150 may include the following steps. First of all, after a flexible material layer is formed on the substrate 100 where the first electrode set 110, the second electrode set 120 and the driving circuit 140 are formed, a portion of the flexible material layer is removed by a removal process to form the elastomer 150 and to lead a portion of the driving circuit 140 to be exposed. Then, after a shielding material layer is formed to cover the exposed portion of the driving circuit 140, a removal process is performed on the shielding material layer to form the shielding element 330 that has the recess portion U. The foregoing removal process includes, for example, a photolithographic etching process.

The following should be noted here. In this embodiment, the shielding element 330 is disposed between the first electrode set 110 and the second electrode set 120 that are adjacent to each other, wherein the first electrode set 110 includes the first electrode 112 configured to receive the first voltage V1 and the second electrode 114 configured to receive the second voltage V2, and the second electrode set 120 includes the third electrode 122 configured to receive the third voltage V3 and the fourth electrode 124 configured to receive the fourth voltage V4. As a result, even if a voltage difference exists between the two electrodes adjacent to the shielding element 330, a lateral electric field is not easily generated due to the shielding effect of the shielding element 330, thereby reducing the phenomenon of electric field crosstalk between the first electrode set 110 and the second electrode set 120. Besides, as described above, since the distance F between the transfer surface 150a and the topmost point of the first electrode 112, the second electrode 114, the third electrode 122 and the fourth electrode 124 and the depth E of the recess portion U satisfy the following relation: E>F, the shielding element 330 may provide a better shielding effect.

On the other hand, as described above, when the transfer device 30 is used to transfer a micro-LED(s), since the transfer device 30 includes the shielding element 330 that reduces the phenomenon of electric field crosstalk between the first electrode set 110 and the second electrode set 120, the transfer device 300 may selectively transfer a specific micro-LED(s) corresponding to one of the first electrode set 110 and the second electrode set 120.

In the embodiments of FIG. 1, FIG. 5 and FIG. 7, the first electrode 112 and the second electrode 114 in the first electrode set 110 and the third electrode 122 and the fourth electrode 124 in the second electrode set 120 are substantially disposed on the same plane, but the disclosure is not limited thereto. In other embodiments, the first electrode and the second electrode in the first electrode set may also be disposed on different planes, and the third electrode and the fourth electrode in the second electrode set may also be disposed on different planes.

In the following, other implementation modes are described with reference to FIGS. 8-10. It should be noted here that the reference numerals and part of the contents of the previous embodiments are used in the following embodiments, in which identical or similar reference numerals indicate identical or similar components, and descriptions of the same technical contents are omitted. Please refer to the description of the previous embodiments for the omitted contents, which will not be repeated hereinafter.

Figure 8:
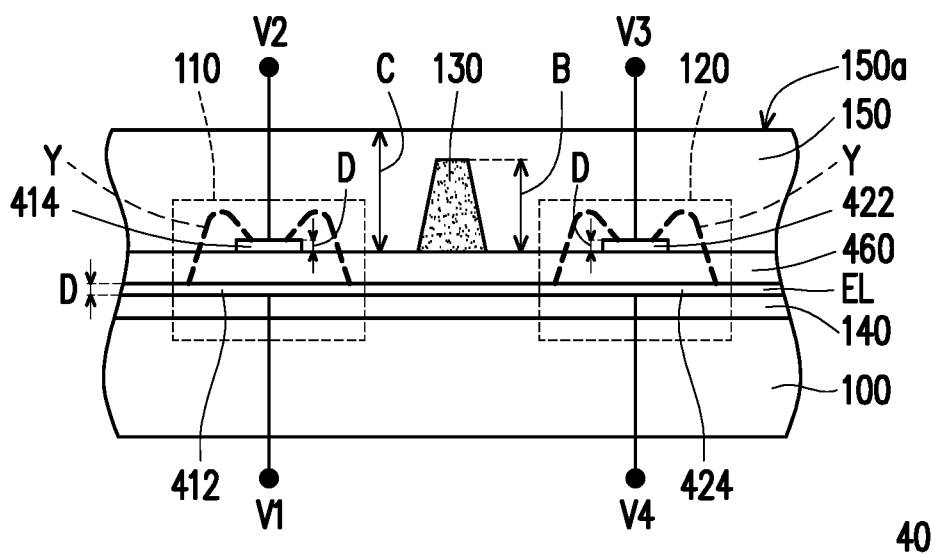
FIG. 8 is a schematic cross-sectional view of a transfer device according to another embodiment of the disclosure.

FIG. 8 is a schematic cross-sectional view of a transfer device according to another embodiment of the disclosure. FIG. 9 is a schematic top view illustrating the configuration relationship between the first electrode set, the second electrode set and the shielding element in FIG. 8. The cross-sectional view as shown in FIG. 8 corresponds to a view taken along the cross-sectional line I-I' of FIG. 9. A transfer device 40 in FIG. 8 is similar to the transfer device 10 in FIG. 1 as described above. Consequently, only the primary differences between them are described hereinafter.

Figure 9:
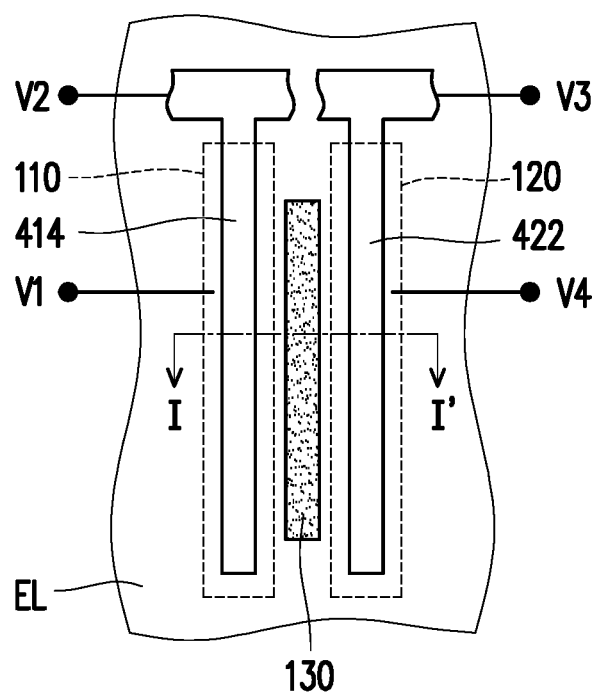
FIG. 9 is a schematic top view illustrating the configuration relationship between the first electrode set, the second electrode set and the shielding element in FIG. 8.

With reference to FIG. 8 and FIG. 9 simultaneously, in this embodiment, the first electrode set 110 includes a first electrode 412 and a second electrode 414, wherein the first electrode 412 and the second electrode 414 are structurally separated from each other, the first electrode 412 is configured to receive the first voltage V1, and the second electrode 414 is configured to receive the second voltage V2. In other words, in this embodiment, the first electrode 412 and the second electrode 414 are electrically connected to different voltage sources. As described above, since a voltage difference exists between the first voltage V1 and the second voltage V2, when the first voltage V1 is applied to the first electrode 412 and the second voltage V2 is applied to the second electrode 414, a lateral electric field Y is formed between the first electrode 412 and the second electrode 414.

The second electrode set 120 includes a third electrode 422 and a fourth electrode 424, wherein the third electrode 422 and the fourth electrode 424 are structurally separated from each other, the third electrode 422 is configured to receive the third voltage V3, and the fourth electrode 424 is configured to receive the fourth voltage V4. In other words, in this embodiment, the third electrode 422 and the fourth electrode 424 are electrically connected to different voltage sources. As described above, since a voltage difference exists between the third voltage V3 and the fourth voltage V4, when the third voltage V3 is applied to the third electrode 422 and the fourth voltage V4 is applied to the fourth electrode 424, a lateral electric field Y is formed between the third electrode 422 and the fourth electrode 424.

In addition, in this embodiment, the second voltage V2 is substantially the same as the third voltage V3, and the first voltage V1 is substantially the same as the fourth voltage V4. In other words, in this embodiment, the third electrode 422 and the second electrode 414 are electrically connected to the same voltage source, and the fourth electrode 424 and the first electrode 412 are electrically connected to the same voltage source. From another perspective, in this embodiment, if the second voltage V2 and the third voltage V3 are high voltages, the first voltage V1 and the fourth voltage V4 are low voltages.

It should be noted that, in this embodiment, the first electrode 412 and the fourth electrode 424 are connected to each other to form an electrode layer EL. In other words, in this embodiment, a portion of the electrode layer EL corresponding to the second electrode 414 serves as the first electrode 412 in the first electrode set 110, and a portion of the electrode layer EL corresponding to the third electrode 422 serves as the fourth electrode 424 in the second electrode set 120.

In addition, in this embodiment, the transfer device 40 further includes an insulating layer 460 disposed on the substrate 100, so that the first electrode 412 and the second electrode 414 are structurally separated from each other and the third electrode 422 and the fourth electrode 424 are structurally separated from each other. Specifically, in this embodiment, the insulating layer 460 is located between the first electrode 412 and the second electrode 414 and between the third electrode 422 and the fourth electrode 424. From another perspective, as shown in FIG. 8, the second electrode 414 and the third electrode 422 are disposed above the insulating layer 460, and the first electrode 412 and the fourth electrode 424 are disposed below the insulating layer 460. In other words, in this embodiment, the electrode layer EL is disposed correspondingly below the second electrode 414 and the third electrode 422, the first electrode 412 and the second electrode 414 in the first electrode set 110 are disposed on different planes, and the third electrode 422 and the fourth electrode 424 in the second electrode set 120 are disposed on different planes.

In this embodiment, the material of the insulating layer 460 may be an inorganic material, an organic material, or a combination of the foregoing. Here, the inorganic material is (but not limited to) silicon oxide, silicon nitride, silicon oxynitride, or a stack layer of at least two of the foregoing materials, for example; and the organic material is (but not limited to) a polymer material, such as polyimide resin, epoxy resin, or acrylic resin, for example.

In this embodiment, the first electrode 412, the second electrode 414, the third electrode 422 and the fourth electrode 424 have a maximum thickness D, and the aforesaid maximum thickness D, the height B of the shielding element 130, and the thickness C of the elastomer 150 satisfy the following relation: C≥B>D. In other words, in one embodiment, the elastomer 150, besides covering the first electrode set 110 and the second electrode set 120, also covers the shielding element 130; and in another embodiment, the elastomer 150 covers the first electrode set 110 and the second electrode set 120 and is flush with the shielding element 130. It should be noted that the shielding element 130 may provide a better shielding effect by making the thickness C of the elastomer 150 greater than or equal to the height B of the shielding element 130 and making the height B of the shielding element 130 greater than the maximum thickness D.

Besides, in this embodiment, although FIG. 8 shows that the first electrode 412, the second electrode 414, the third electrode 422 and the fourth electrode 424 are identical in thickness and all have the maximum thickness D, the disclosure is not limited thereto. In other embodiments, the first electrode 412, the second electrode 414, the third electrode 422 and the fourth electrode 424 may also have different thicknesses, and herein at least one to three of the first electrode 412, the second electrode 414, the third electrode 422 and the fourth electrode 424 have the maximum thickness D that is smaller than the height B of the shielding element 130 and smaller than the thickness C of the elastomer 150. In other words, the scope of the disclosure covers any case where at least one of the first electrode 412, the second electrode 414, the third electrode 422 and the fourth electrode 424 has the maximum thickness D.

In this embodiment, the shielding element 130 is located between the second electrode 414 in the first electrode set 110 and the third electrode 422 in the second electrode set 120. From another perspective, the shielding element 130, the second electrode 414 and the third electrode 422 are substantially disposed on the same plane, that is, the shielding element 130, the second electrode 414 and the third electrode 422 are substantially disposed on the insulating layer 460.

In addition, as described in the embodiment of FIG. 1, the driving circuit 140 is used to electrically connect external signals (such as the first voltage V1, the second voltage V2, the third voltage V3, the fourth voltage V4) to the first electrode set 110 and the second electrode set 120. The driving circuit 140 is, for example, any active device array layer used in a display device known to those skilled in the art. Accordingly, in one embodiment, the second electrode 414 and the third electrode 422 are, for example, respectively electrically connected to the corresponding transistors that serve as switching devices, and the aforesaid transistors may respectively be connected to the corresponding connection pads by the corresponding signal lines so as to be electrically connected to the external signals. Besides, the electrode layer EL including the first electrode 412 and the fourth electrode 424 is, for example, electrically connected to the corresponding signal lines, and the aforesaid signal lines are connected to the corresponding connection pads so as to be electrically connected to the external signals. The electrode layer EL including the first electrode 412 and the fourth electrode 424 is configured to receive a common voltage by the external signals, for example.

The following should be noted here. In this embodiment, the shielding element 130 is disposed between the first electrode set 110 and the second electrode set 120 that are adjacent to each other, wherein the first electrode set 110 includes the first electrode 412 configured to receive the first voltage V1 and the second electrode 414 configured to receive the second voltage V2, and the second electrode set 120 includes the third electrode 422 configured to receive the third voltage V3 and the fourth electrode 424 configured to receive the fourth voltage V4. As a result, even if a voltage difference exists between the two electrodes adjacent to the shielding element 130, a lateral electric field is not easily generated due to the shielding effect of the shielding element 130, thereby reducing the phenomenon of electric field crosstalk between the first electrode set 110 and the second electrode set 120. Besides, as described above, since the maximum thickness D of the first electrode 412, the second electrode 414, the third electrode 422 and the fourth electrode 424, the height B of the shielding element 130, and the thickness C of the elastomer 150 satisfy the following relation: C≥B>D, the shielding element 130 may provide a better shielding effect.

In addition, in light of FIGS. 4A-4D, the transfer device 40 is provided with the shielding element 130 disposed between the first electrode set 110 and the second electrode set 120 so as to reduce the phenomenon of electric field crosstalk between the first electrode set 110 and the second electrode set 120. As a result, the transfer device 40 may selectively transfer a specific micro-LED(s) corresponding to one of the first electrode set 110 and the second electrode set 120. For example, in one embodiment, it is desired that the lateral electric field Y is only formed between the first electrode 412 and the second electrode 414 but is not formed between the third electrode 422 and the fourth electrode 424, so that the transfer device 40 may selectively transfer a specific micro-LED(s) corresponding to the first electrode set 110. To achieve this goal, while the driving circuit 140 selectively drives the first electrode set 110 to apply the first voltage V1 and the second voltage V2 to the first electrode 412 and the second electrode 414 respectively, a voltage (for example, the fourth voltage V4 and the third voltage V3 are substantially the same as the first voltage V1) is simultaneously applied to both the third electrode 422 and the fourth electrode 424. In this way, through the shielding effect provided by the shielding element 130, when the lateral electric field generated between first electrode 412 and the second electrode 414 affects the elastomer 150, only a portion of the transfer surface 150*a* corresponding to the first electrode set 110 has an uneven appearance, so that the micro-LED(s) corresponding to the first electrode set 110 is selectively detached.

In addition, in the embodiment of FIG. 8, even though the first electrode set 110 includes one first electrode 412 and one second electrode 414 and the second electrode set 120 includes one third electrode 422 and one fourth electrode 424, in light of the embodiment in FIG. 5 and FIG. 6, the first electrode set 110 may also include a plurality of first electrodes 412 and a plurality of second electrodes 414 and the second electrode set 120 may also include a plurality of third electrodes 422 and a plurality of fourth electrodes 424 in accordance with the size of the micro-LED(s) to be transferred.

In addition, in this embodiment, since the driving circuit 140 may be any active device array layer used in a display device known to those skilled in the art, and since the first electrode 412 and the second electrode 414 in the first electrode set 110 are disposed on different planes and the third electrode 422 and the fourth electrode 424 in the second electrode set 120 are disposed on different planes, the transfer device 40 thus has a design similar to fringe field switch (FPS), thereby making the manufacture of the transfer device 40 compatible with the existing processes of a display device.

Furthermore, in light of FIG. 1 and FIG. 7, in the transfer device 40 of FIG. 8, the shielding element 130 may be replaced by a shielding element shown in FIG. 7. In the following, another implementation mode is described with reference to FIG. 10. It should be noted here that the reference numerals and part of the contents of the previous embodiments are used in the following embodiment, in which identical or similar reference numerals indicate identical or similar components, and descriptions of the same technical contents are omitted. Please refer to the description of the previous embodiments for the omitted contents, which will not be repeated hereinafter.

Figure 10:
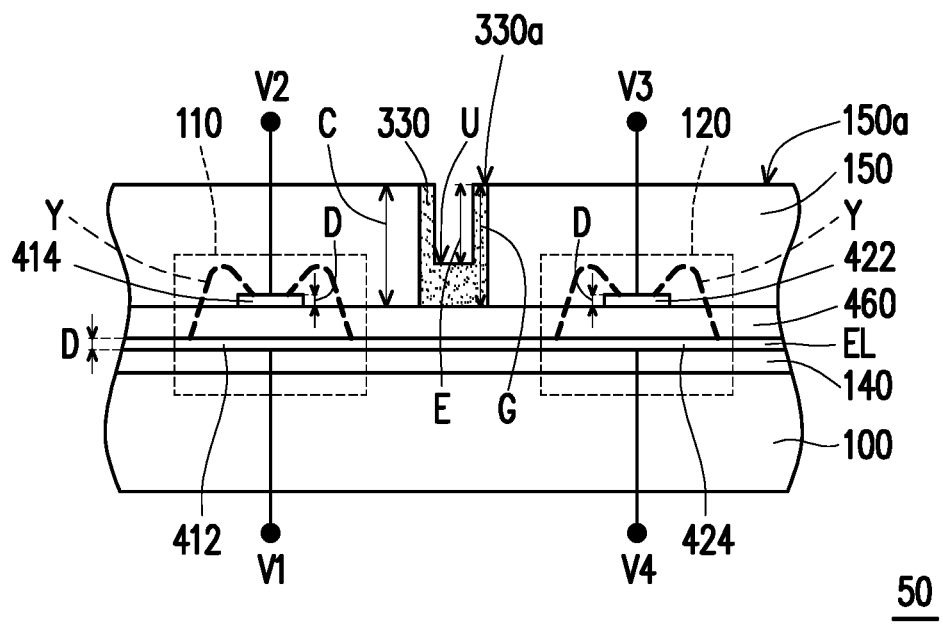
FIG. 10 is a schematic cross-sectional view of a transfer device according to another embodiment of the disclosure.

FIG. 10 is a schematic cross-sectional view of a transfer device according to another embodiment of the disclosure. A transfer device 50 in FIG. 10 is similar to the transfer device 40 in FIG. 8 as described above. Consequently, only the primary differences between them are described hereinafter.

With reference to FIG. 10, in this embodiment, a shielding element 330 is disposed on the substrate 100 and located between the first electrode set 110 and the second electrode set 120. Specifically, in this embodiment, the shielding element 330 is located between the second electrode 414 in the first electrode set 110 and the third electrode 422 in the second electrode set 120, and is located between the first electrode 412 in the first electrode set 110 and the fourth electrode 424 in the second electrode set 120. As described above, since the first electrode 412 vertically corresponds with the second electrode 414 and the third electrode 422 vertically corresponds with the fourth electrode 424, the shielding element 330 is also located between the second electrode 414 in the first electrode set 110 and the fourth electrode 424 in the second electrode set 120, and is also located between the first electrode 412 in the first electrode set 110 and the third electrode 422 in the second electrode set 120.

In this embodiment, a surface 330*a* of the shielding element 330, which is connected to the transfer surface 150*a* of the elastomer 150, has a recess portion U. In other words, in this embodiment, the shielding element 330 has a height G that is substantially the same as the thickness C of the elastomer 150. In addition, in this embodiment, although FIG. 10 shows that the cross-sectional contour of the recess portion U is in a rectangular shape, the disclosure is not limited thereto. In other embodiments, the cross-sectional contour of the recess portion U may also be in a trapezoidal shape, an inverted trapezoidal shape, a triangular shape or an arc shape.

In this embodiment, the thickness C of the elastomer 150 and a depth E of the recess portion U satisfy the following relation: C>E. Specifically, in one embodiment, in the case where the first electrode 412, the second electrode 414, the third electrode 422 and the fourth electrode 424 have the maximum thickness D that is smaller than the thickness C of the elastomer 150, the depth E is approximately 5% to 99% of the thickness C. It should be noted that the shielding element 330 may provide a better shielding effect by making the depth E of the recess portion U approximately 5% to 99% of the thickness C.

In this embodiment, the material of the shielding element 330 may be the same as the material of the elastomer 150. In other words, the shielding element 330 at this time is integrally formed with the elastomer 150. In addition, the method of forming the shielding element 330 and the elastomer 150 may include the following steps: after a flexible material layer is formed on the substrate 100 where the first electrode set 110, the second electrode set 120, the driving circuit 140 and the insulating layer 460 are formed, a removal process is performed to form the elastomer 150 and the shielding element 330 that has the recess portion U. Herein the removal process includes, for example, a photolithographic etching process.

In addition, in this embodiment, the material of the shielding element 330 may also be different from the material of the elastomer 150. At this time, the material of the shielding element 330 is, for example, an insulating material. The insulating material includes, for example, an inorganic material, an organic material, a combination of the foregoing or a stack layer thereof. Here, the inorganic material is (but not limited to) silicon oxide, silicon nitride, silicon oxynitride, a combination of the foregoing or other suitable materials, for example; and the organic material is (but not limited to) polyester (PET), polyalkene, polyacryl, polycarbonate, polyalkylene oxide, polyphenylene, polyether, polyketone, polyalcohol, polyaldehyde, a combination of the foregoing or other suitable materials, for example. In addition, the method of forming the shielding element 330 and the elastomer 150 may include the following steps. First of all, after a flexible material layer is formed on the substrate 100 where the first electrode set 110, the second electrode set 120, the driving circuit 140 and the insulating layer 460 are formed, a portion of the flexible material layer is removed by a removal process to form the elastomer 150 and to lead a portion of the insulating layer 460 to be exposed. Then, after a shielding material layer is formed to cover the exposed portion of the insulating layer 460, a removal process is performed on the shielding material layer to form the shielding element 330 that has the recess portion U. The foregoing removal process includes, for example, a photolithographic etching process.

The following should be noted here. In this embodiment, the shielding element 330 is disposed between the first electrode set 110 and the second electrode set 120 that are adjacent to each other, wherein the first electrode set 110 includes the first electrode 412 configured to receive a first voltage V1 and the second electrode 414 configured to receive a second voltage V2, and the second electrode set 120 includes the third electrode 422 configured to receive a third voltage V3 and the fourth electrode 424 configured to receive a fourth voltage V4. As a result, even if a voltage difference exists between the two electrodes adjacent to the shielding element 330, a lateral electric field is not easily generated due to the shielding effect of the shielding element 330, thereby reducing the phenomenon of electric field crosstalk between the first electrode set 110 and the second electrode set 120. In addition, as described above, the shielding element 330 may provide a better shielding effect by making the depth E of the recess portion U approximately 5% to 99% of the thickness C.

On the other hand, as described above, when the transfer device 50 is used to transfer a micro-LED(s), since the transfer device 50 includes the shielding element 330 that reduces the phenomenon of electric field crosstalk between the first electrode set 110 and the second electrode set 120, the transfer device 50 may selectively transfer a specific micro-LED(s) corresponding to one of the first electrode set 110 and the second electrode set 120.

In summary, in the transfer device provided by this disclosure, the elastomer having the transfer surface covers the first electrode set and the second electrode set that are adjacent to each other, and the shielding element is disposed between the adjacent first and second electrode sets, wherein the first electrode set includes the first electrode configured to receive the first voltage and the second electrode configured to receive the second voltage, the second electrode set includes the third electrode configured to receive the third voltage and the fourth electrode configured to receive the fourth voltage, a voltage difference exists between the first voltage and the second voltage and a voltage difference exists between the third voltage and the fourth voltage. As a result, the transfer device in this disclosure may achieve the transfer function without any patterned structure disposed on the transfer surface, and the phenomenon of electric field crosstalk between the first electrode set and the second electrode set is reduced due to the shielding effect of the shielding element. In this way, compared with the conventional transfer device having a plurality of transfer bumps, the transfer device in this disclosure may achieve high process yield and operation precision when applied to the mass transfer process. Besides, when the transfer device in this disclosure is used to transfer a micro-LED(s), it is possible to selectively transfer a specific micro-LED(s).

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transfer device, comprising:
a substrate;
a first electrode set disposed on the substrate, the first electrode set comprising:
a first electrode configured to receive a first voltage; and
a second electrode configured to receive a second voltage and structurally separated from the first electrode, wherein a voltage difference exists between the first voltage and the second voltage;
a second electrode set disposed on the substrate and disposed adjacent to the first electrode set, wherein the second electrode set comprises:
a third electrode configured to receive a third voltage; and
a fourth electrode configured to receive a fourth voltage and structurally separated from the third electrode, wherein a voltage difference exists between the third voltage and the fourth voltage;
a shielding element disposed on the substrate and located between the first electrode set and the second electrode set, wherein the shielding element is located between the second electrode in the first electrode set and the third electrode in the second electrode set;
a driving circuit disposed on the substrate and electrically connected to the first electrode set and the second electrode set; and
an elastomer disposed on the substrate and covering the first electrode set and the second electrode set, wherein the elastomer has a transfer surface.

2. The transfer device as recited in claim 1, wherein a bottom surface of the shielding element is connected to a bottom surface of the elastomer, and the bottom surface of the elastomer is disposed opposite to the transfer surface.

3. The transfer device as recited in claim 2, wherein a dielectric constant of the shielding element is in a range of 0.1 to 15.

4. The transfer device as recited in claim 2, wherein at least one of the first electrode, the second electrode, the third electrode and the fourth electrode has a topmost point, a distance between the topmost point and a top surface of the substrate is A, a height of the shielding element is B, a thickness of the elastomer is C, and $C \geq B > A$.

5. The transfer device as recited in claim 2, wherein at least one of the first electrode, the second electrode, the third electrode and the fourth electrode has a maximum thickness that is D, a height of the shielding element is B, a thickness of the elastomer is C, and $C \geq B > D$.

6. The transfer device as recited in claim 2, wherein a surface of the shielding element connected to the transfer surface has a recess portion.

7. The transfer device as recited in claim 6, wherein a thickness of the elastomer is C, a depth of the recess portion is E, and $C > E$.

8. The transfer device as recited in claim 7, wherein at least one of the first electrode, the second electrode, the third electrode and the fourth electrode has a topmost point, a distance between the topmost point and the transfer surface is F, and $E > F$.

9. The transfer device as recited in claim 1, further comprising:
- a plurality of bumps disposed on the substrate and disposed correspondingly to the first electrode, the second electrode, the third electrode and the fourth electrode, wherein each of the first electrode, the second electrode, the third electrode and the fourth electrode at least covers a top surface of the corresponding bump.

10. The transfer device as recited in claim 9, wherein each of the first electrode, the second electrode, the third electrode and the fourth electrode further covers a side surface of the corresponding bump.

11. The transfer device as recited in claim 1, further comprising an insulating layer disposed on the substrate, wherein the insulating layer is located between the first electrode and the second electrode and between the third electrode and the fourth electrode.

12. The transfer device as recited in claim 1, wherein the first voltage is substantially the same as the third voltage, and the second voltage is substantially the same as the fourth voltage.

13. The transfer device as recited in claim 1, wherein the second voltage is substantially the same as the third voltage, and the first voltage is substantially the same as the fourth voltage.

* * * * *